United States Patent
Park

(10) Patent No.: US 8,050,120 B2
(45) Date of Patent: Nov. 1, 2011

(54) SENSING DELAY CIRCUIT AND SEMICONDUCTOR MEMORY DEVICE USING THE SAME

(75) Inventor: Sang Il Park, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 607 days.

(21) Appl. No.: 12/228,971

(22) Filed: Aug. 19, 2008

(65) Prior Publication Data

US 2009/0268533 A1 Oct. 29, 2009

(30) Foreign Application Priority Data

Apr. 28, 2008 (KR) .......................... 10-2008-0039589

(51) Int. Cl.
*G11C 7/00* (2006.01)
(52) U.S. Cl. .................... 365/194; 365/189.05; 365/201; 365/189.08
(58) Field of Classification Search .................. 365/194, 365/189.05, 201, 189.08
See application file for complete search history.

(56) References Cited

U.S. PATENT DOCUMENTS

| 6,577,546 | B2 * | 6/2003 | Fujiwara et al. | ............... 365/201 |
| 7,154,808 | B2 * | 12/2006 | Shim | ......................... 365/230.04 |
| 2006/0209606 | A1 | 9/2006 | Rajwani et al. | |

FOREIGN PATENT DOCUMENTS

| JP | H05-101658 | 4/1993 |
| KR | 10-2004-0093789 A | 11/2004 |

* cited by examiner

*Primary Examiner* — Son Dinh
(74) *Attorney, Agent, or Firm* — John P. White; Cooper & Dunham LLP

(57) ABSTRACT

A sensing delay circuit includes a logic element which responds to a test mode signal to transfer a start signal, a delay unit which is configured of a plurality of inverters having MOS transistors with controlled threshold voltage, and receives external voltage as bulk voltage and delays an output signal from the logic element by a predetermined period, and a buffer which responds to an output signal from the delay unit to buffer the output signal from the logic element and output it.

24 Claims, 6 Drawing Sheets

SENSING DELAY CIRCUIT AND SEMICONDUCTOR MEMORY DEVICE USING THE SAME

TECHNICAL FIELD

The present disclosure relates to a semiconductor memory device, and more particularly to a sensing delay circuit capable of preventing a sensing fail, which can be caused by an early driving period of a sense amplifier at high external voltage (VDD) level.

BACKGROUND

With the progress of a technology of a computer system or a telecommunication field, or the like, a demand for a low-cost, small-sized, and large-capacity semiconductor memory device used for storing information has been gradually increased. Further, since a demand for energy efficiency has also been increased, the technology development of the semiconductor memory device shows a tendency to suppress unnecessary current consumption.

Generally, a cell array storing data of a DRAM device has a structure that each of a plurality of cells configured of one NMOS transistor and one capacitor is connected to word lines and bit lines connected to each other in a net form.

An operation of a general DRAM device will be described briefly.

First, a /RAS signal, which is a main signal operating the DRAM device, is changed into an active state (low) and at the same time, an address signal input to a row address buffer is received. At this time, a row decoding operation selecting one of the word lines of the cell array by decoding the received row address signal is performed.

When the data of the cells connected to the selected word line are carried on a bit line pair BL, /BL configured of a bit line and a complementary bit line, a sense amplifier enable signal informing the operation timing of the sense amplifier is enabled to drive a bit line sense amplifier in a cell block selected by the row address. When the bit line sense amplifier is driven, the bit line pair BL, /BL maintaining predetermined potential difference ΔV by charge sharing is amplified at large potential difference. Thereafter, a column decoder selected by a column address turns-on a column transfer transistor transferring the data of the bit line to data bus lines to transfer the data transferred to the bit line pair BL, /BL to the data bus lines DB, DB/, which are then output to the outside of the device.

In the DRAM operation, the bit line sense amplifier should be driven after securing a sensing delay period shown in FIG. 1. In other words, the sense amplifier should be driven after securing sufficient potential difference ΔV between the bit line pair BL, /BL by the charge sharing, making it possible to prevent a phenomenon that the data of the bit line pair BL, /BL are reversed during the driving of the bit line sense amplifier.

Therefore, the bit line sense amplifier is controlled to be driven after securing sufficient potential difference ΔV between the bit line pair BL, /BL by controlling the enable start period of the sense amplifier enable signal using the delay circuit in the related art.

However, a core voltage VCORE level, which drives the delay circuit, rises when the external voltage VDD level is high or upon over driving so that the driving capability of the delay circuit is increased, thereby leading to a phenomenon that the delay period is short. When the delay period is short, the enable start period of the sense amplifier enable signal is early so that the sense amplifier is driven at a state where sufficient potential difference ΔV between the bit line pair BL, /BL is not secured, thereby leading to the phenomenon that the data of the bit line pair BL, /BL are reversed during the driving of the bit line sense amplifier.

SUMMARY

In an aspect of the present disclosure, a sensing delay circuit and a semiconductor memory device using the same are provided which are capable of preventing a sensing fail, which can be caused by an early driving period of a bit line sense amplifier at high external voltage (VDD) level, by controlling an enable period of a sense amplifier enable signal, using a MOS transistor which utilizes the external voltage VDD as bulk voltage.

In an exemplary embodiment, a sensing delay circuit includes a logic element which responds to a test mode signal to transfer a start signal, a delay unit including a plurality of inverters having MOS transistors with controlled threshold voltage, and configured to receive external voltage as bulk voltage and delay an output signal from the logic element by a predetermined period, and a buffer which responds to an output signal from the delay unit to buffer the output signal from the logic element and output it.

In another embodiment, preferably, the logic element receives the test mode signal and the start signal and performs an NAND operation.

In another embodiment, each of the plurality of inverters included in the delay unit includes a pull-up element which receives the external voltage as the bulk voltage and is connected between an internal voltage and an output node to pull-up drive the output node in response to a signal from an input node, and a pull-down element which is connected between the output node and a ground voltage to pull-down drives the output node in response to the signal from the input node.

In another embodiment, the buffer includes a pull-up element which is connected between the internal voltage and a first node to pull-up drive the first node in response to the output signal from the logic element, a pull-down element which is connected between the first node and a second node to pull-down drive the first node in response to the output signal from the logic element to, and an enable element which is connected between the second node and the ground voltage to be turned-on in response to the output signal from the delay unit.

In another embodiment, preferably, the enable element is turned-on in a period elapsed by the delay period of the delay unit after the start signal is enabled.

In another embodiment, the sensing delay circuit further includes a voltage setting unit which is connected between the internal voltage and the first node to pull-up drive the first node in response to the output signal from the delay unit, and an output unit which buffers the signal from the first node in response to the test mode signal to output it as the sense amplifier enable signal.

In another embodiment, a sensing delay circuit includes a first sensing delay unit which includes MOS transistors with controlled threshold voltage, and receives internal voltage as bulk voltage, control an enable period of a start signal in response to a test mode signal, and generates a sense amplifier enable signal, and a second sensing delay unit which includes MOS transistors with controlled threshold voltage, receives external voltage as the bulk voltage, controls the enable period of the start signal in response to the test mode signal, and generates the sense amplifier enable signal.

In another embodiment, a semiconductor memory device includes a sensing delay circuit which includes a MOS transistor with controlled threshold voltage, receives either internal voltage or external voltage as bulk voltage, controls an enable period of a start signal in response to a test mode signal, and generates a sense amplifier enable signal, and a sense amplifier receives and is driven by the sense amplifier enable signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, exemplary embodiments of the present disclosure will be described with reference to accompanying drawings. However, the embodiments are for illustrative purposes only and are not intend to limit the scope of the disclosure.

Figure 1:
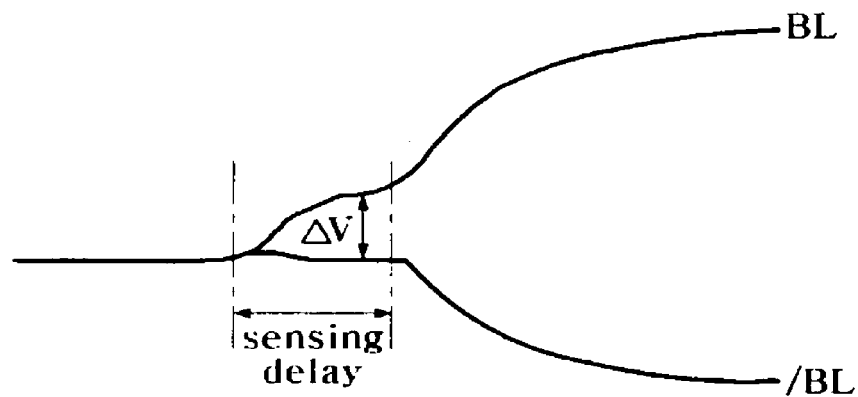
FIG. 1 is a diagram showing a waveform of a bit line pair driven by a sense amplifier according to the related art.
Figure 2:
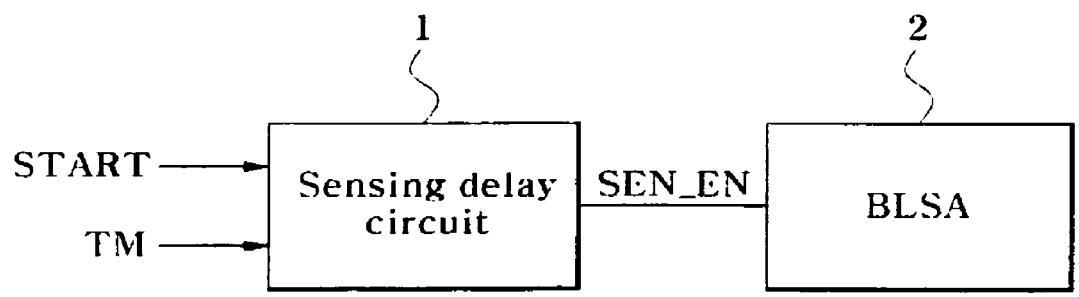
FIG. 2 is a block diagram showing a configuration of a semiconductor memory device according to an exemplary embodiment of the present disclosure.

FIG. 2 is a block diagram showing a configuration of a semiconductor memory device according to one embodiment of the present disclosure.

As shown, the semiconductor device according to the present embodiment includes a sensing delay circuit 1 which receives a start signal START and a test mode signal TM and generates a sense amplifier enable signal SEN_EN, and a bit line sense amplifier (BLSA) 2 which receives and is driven by the sense amplifier enable signal SEN_EN.

Figure 3:
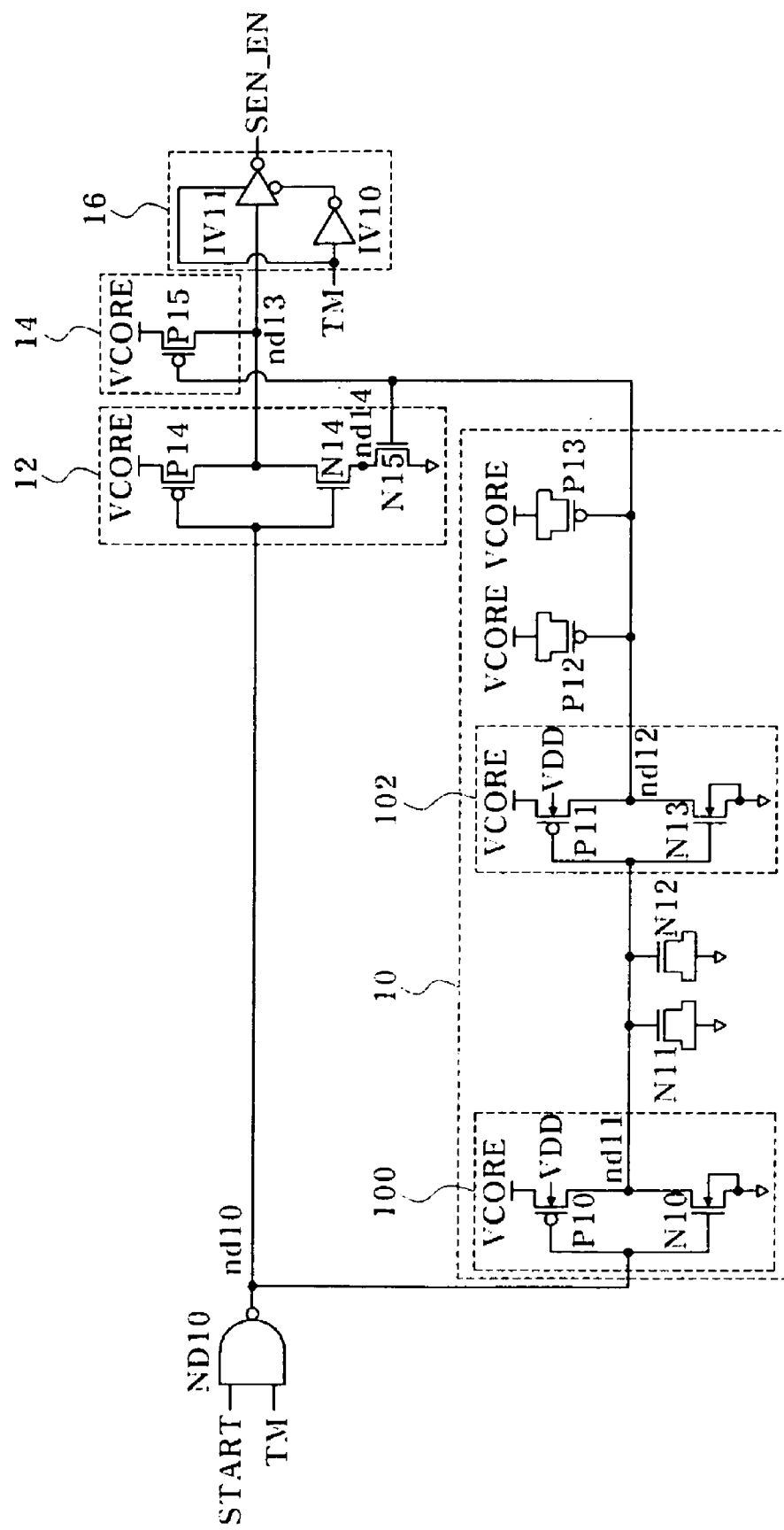
FIG. 3 is a circuit diagram of a sensing delay circuit included in the semiconductor memory device shown in FIG. 2.
Figure 4:
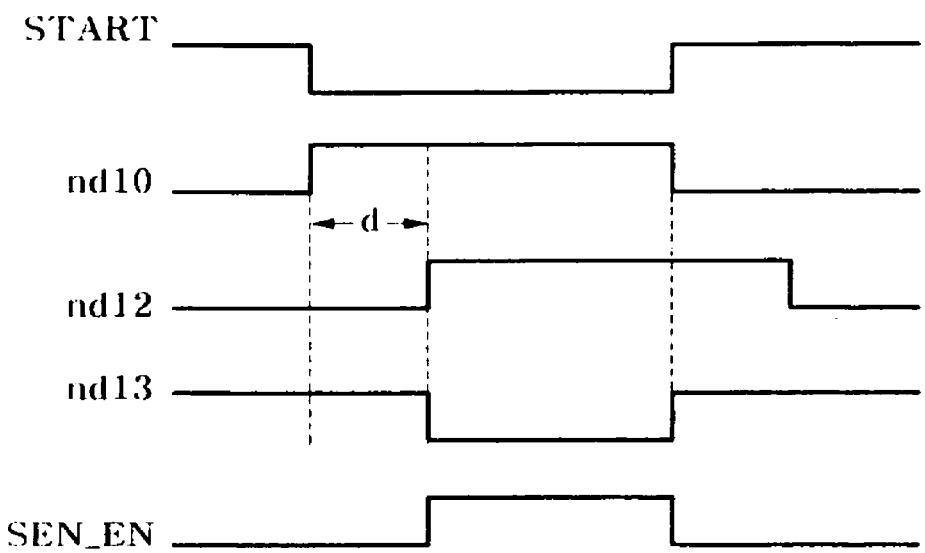
FIG. 4 is a timing diagram for explaining the operation of the sensing delay circuit shown in FIG. 3.

As shown in FIG. 3, the sensing delay circuit 1 includes an NAND gate ND10, a first delay unit 10, a first buffer 12, a first voltage setting unit 14, and a first output unit 16.

The NAND gate ND10 responds to the high-level test mode signal TM to invert the start signal START and transfer it to a node nd10.

The first delay unit 10 delays an input signal through an RC delay and outputs a delayed signal to node nd12, and includes a first inverter 100, a second inverter 102, NMOS transistors N11, N12 connected to a node nd11, and PMOS transistors P12, P13 connected to a node nd12.

The first inverter 100 includes a PMOS transistor P10 which is connected between a core voltage VCORE and the node nd11 to pull-up drive the node nd11 in response to a signal from the node nd10 and an NMOS transistor N10 which is connected between the node nd11 and a ground voltage VSS to pull-down drive the node nd11 in response to a signal from the node nd10. Herein, external voltage VDD is supplied as the bulk voltage of the PMOS transistor P10.

The second inverter 102 includes a PMOS transistor P11 which is connected between the core voltage VCORE and the node nd12 to pull-up drive the node nd12 in response to a signal from the node nd11 and an NMOS transistor N13 which is connected between the node nd12 and the ground voltage VSS to pull-down drive the node nd12 in response to a signal from the node nd11. Herein, the external voltage VDD is supplied as the bulk voltage of the PMOS transistor P11.

The present exemplary embodiment is described, by way of example, in a case in which the external voltage VDD is supplied as the bulk voltage of the PMOS transistor P10 included in the first inverter 100 and as the bulk voltage of the PMOS transistor P11 included in the second inverter 102. However, in other exemplary embodiments, the core voltage may be supplied as the bulk voltage of the PMOS transistor P11.

The first buffer 12 includes a PMOS transistor P14 which is connected between the core voltage VCORE and a node nd13 to pull-up drive the node nd13 in response to the signal from the node nd10, an NMOS transistor N14 which is connected between the node nd13 and an node nd14 to pull-down drive the node nd13 in response to the signal from the node nd10, and an NMOS transistor N15 which is connected between the node nd14 and the ground voltage VSS to be turned-on in response to the signal from the node nd12.

The first voltage setting unit 14 includes a PMOS transistor P15 which is connected between the core voltage VCORE and the node nd13 to pull-up drive the node nd13 in response to the signal from the node nd12.

The first output unit 16 includes a transfer element IV11 which responds to the high-level test mode signal TM to invert the signal from the node nd13 and transfer it as the sense amplifier enable signal SEN_EN.

The bit line sense amplifier 2 is driven in response to the enable of the sense amplifier enable signal SEN_EN to amplify data of a bit line pair BL, /BL The operation of the semiconductor memory device configured as above will be described below.

First, the sensing delay circuit 1 responds to the test mode signal TM enabled at a high level to delay an enable start period of the start signal START by a predetermined period.

When the high-level test mode signal TM is input, the NAND gate ND10 inverts the start signal START and outputs it to the node nd10. The signal from the node nd10 is delayed by a delay period d through the first delay unit 10 and is output to the node nd12. The NMOS transistor N15 included in the first buffer 12 is turned-on in a period where the signal from the node nd12 is a high level so that the first buffer 12 inverts the signal from the node nd10 into the signal from the node nd13 in a period where the signal from the node nd12 is the high level and transfers the inverted signal. Therefore, the enable start period of the sense amplifier enable signal SEN_EN is delayed by the delay period d relative to the enable start period of the start signal START.

The sense amplifier enable signal SEN_EN generated in the sensing delay circuit 1 of the present embodiment as described above controls the driving of the bit line sense amplifier 2. In other words, the bit line sense amplifier 2 is driven after securing sufficient potential difference ΔV between the bit line pair BL, /BL by the sense amplifier enable signal SEN_EN.

The sensing delay circuit of the present embodiment supplies the external voltage VDD as the bulk voltage of the PMOS transistor P10 and as the bulk voltage of the PMOS transistor P11 included in the first inverter 100 and the second inverter 102, respectively. Therefore, when the external voltage VDD level is high upon over driving, although the core voltage VCORE level rises, the threshold voltage of the PMOS transistor P10 and the PMOS transistor P11 also rises so that the delay period d of the first delay unit 10 is not short. In other words, the rising effect of the current drivability of the PMOS transistor P10 and the PMOS transistor P11 according to the rising of the core voltage VCORE level is offset with the rising effect of the threshold voltage of the PMOS transistor P10 and the PMOS transistor P11 according to the rising of the bulk voltage. Although the external voltage VDD level is high, the enable start period of the sense amplifier enable signal SEN_EN is not early so that the sensing delay circuit 1 of the present embodiment drives the bit line sense amplifier in the state where sufficient potential difference ΔV between the bit line pair BL, /BL is secured.

Figure 5:
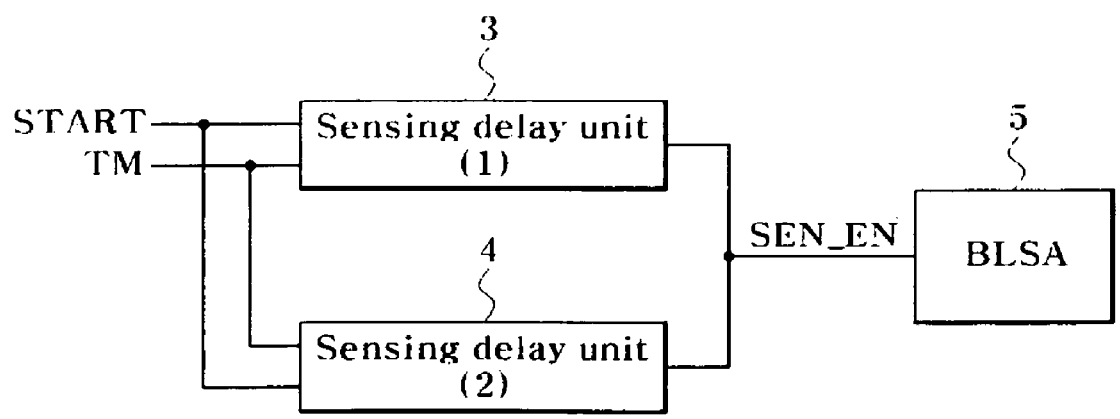
FIG. 5 is a block diagram showing a configuration of a semiconductor memory device according to another exemplary embodiment of the present disclosure.

FIG. 5 is a block diagram showing a configuration of a semiconductor memory device according to another exemplary embodiment of the present disclosure.

As shown, the semiconductor memory device according to the present disclosure includes a first sensing delay unit 3 which receives the start signal START and the test mode signal TM, and generates the sense amp enable signal SEN_SN, a second sensing delay unit 4 which receives the start signal START and the test mode signal TM, and generates the sense amp enable signal SEN_SN, and a bit line sense amplifier 5 which receives and is driven by the sense amp enable signal SEN_SN.

Figure 6:
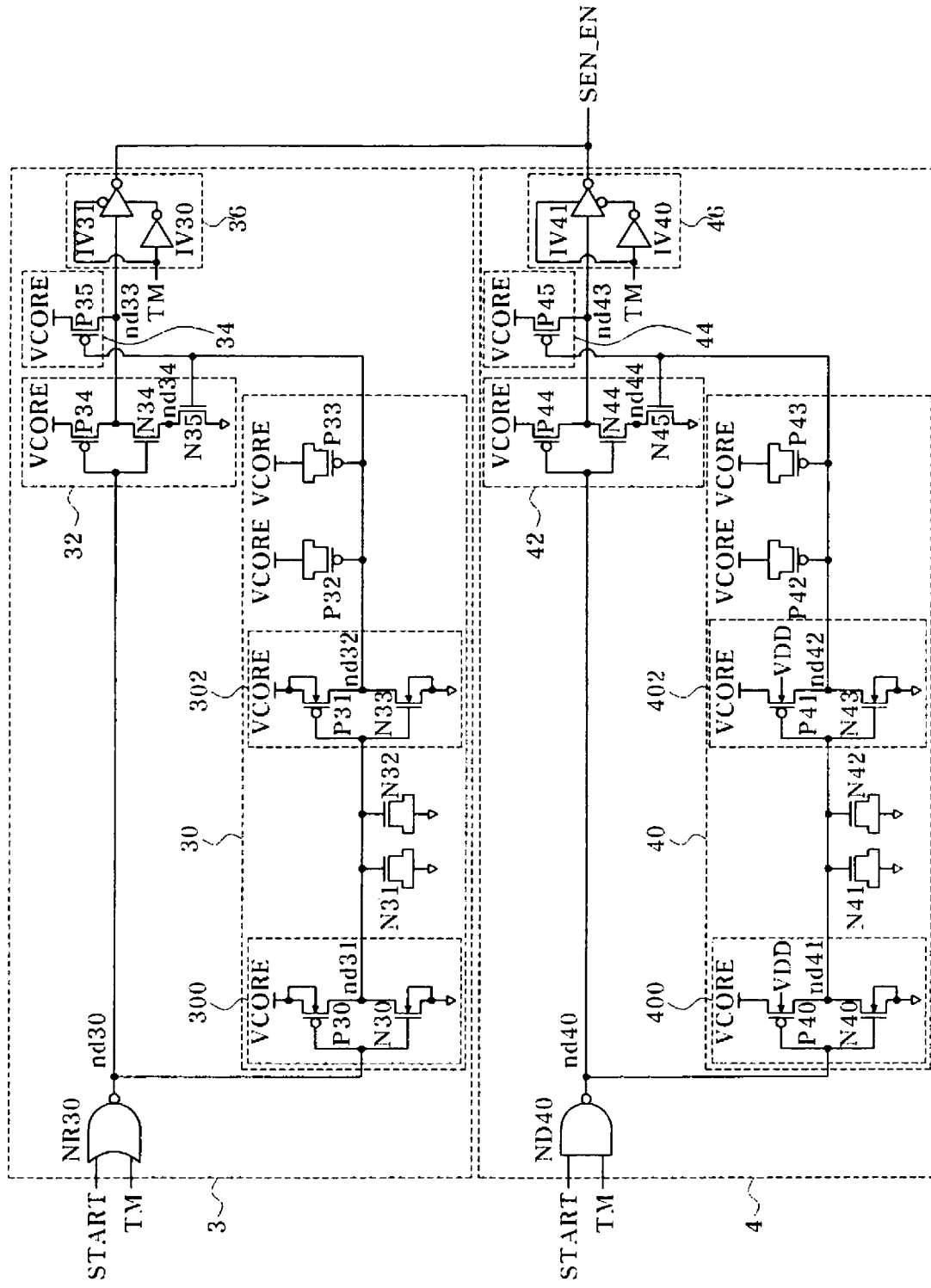
FIG. 6 is a circuit diagram of first and second sensing delay units included in the semiconductor memory device shown in FIG. 5.

As shown in FIG. 6, the first sensing delay unit 3 includes a NOR gate NR30, a second delay unit 30, a second buffer 32, a second voltage setting unit 34, and a second output unit 36.

The NOR gate NR30 inverts the start signal START in response to the low-level test mode signal TM and transfers it to a node nd30.

The second delay unit 30 delays an input signal through the RC delay and outputs a delayed signal to node nd32, and includes a third inverter 300, a fourth inverter 302, NMOS transistors N31, N32 connected to a node nd31, and PMOS transistors P32, P33 connected to a node nd32.

The third inverter 300 includes a PMOS transistor P30 which is connected between the core voltage VCORE and the node nd31 to pull-up drive the node nd31 in response to a signal from the node nd30 and an NMOS transistor N30 which is connected between the node nd31 and the ground voltage VSS to pull-down drive the node nd31 in response to a signal from the node nd30. Herein, the core voltage VCORE is supplied as the bulk voltage of the PMOS transistor P30.

The fourth inverter 302 includes a PMOS transistor P31 which is connected between the core voltage VCORE and the node nd32 to pull-up drive the node nd32 in response to a signal from the node nd31 and an NMOS transistor N33 which is connected between the node nd32 and the ground voltage VSS to pull-down drive the node nd32 in response to a signal from the node nd31. Herein, the core voltage VCORE is supplied as the bulk voltage of the PMOS transistor P31.

The second buffer 32 includes a PMOS transistor P34 which is connected between the core voltage VCORE and a node nd33 to pull-up drive the node nd33 in response to the signal from the node nd30, an NMOS transistor N34 which is connected between the node nd33 and an node nd34 to pull-down drive the node nd33 in response to the signal from the node nd30, and an NMOS transistor N35 which is connected between the node nd34 and the ground voltage VSS to be turned-on in response to the signal from the node nd32.

The second voltage setting unit 34 includes a PMOS transistor P35 which is connected between the core voltage VCORE and the node nd33 to pull-up drive the node nd33 in response to the signal from the node nd32.

The second output unit 36 includes a transfer element IV31 which responds to the low-level test mode signal TM to invert the signal from the node nd33 and transfer it as the sense amplifier enable signal SEN_EN.

As shown in FIG. 6, the sensing delay unit 4 includes an NAND gate ND40, a third delay unit 40, a third buffer 42, a third voltage setting unit 44, and a third output unit 46.

The NAND gate NR40 inverts the start signal START in response to the high-level test mode signal TM and transfers it to a node nd40.

The third delay unit 40 delays an input signal through the RC delay and outputs a delayed signal to node nd42, and includes a fifth inverter 400, a sixth inverter 402, NMOS transistors N41, N42 connected to a node nd41, PMOS transistors P42, P43 connected to a node nd42.

The fifth inverter 400 includes a PMOS transistor P40 which is connected between the core voltage VCORE and the node nd41 to pull-up drive the node nd41 in response to a signal from the node nd40 and an NMOS transistor N40 which is connected between the node nd41 and the ground voltage VSS to pull-down drive the node nd41 in response to a signal from the node nd40. Herein, the external voltage VDD is supplied as the bulk voltage of the PMOS transistor P40.

The sixth inverter 402 includes a PMOS transistor P41 which is connected between the core voltage VCORE and the node nd42 to pull-up drive the node nd42 in response to a signal from the node nd41 and an NMOS transistor N43 which is connected between the node nd42 and the ground voltage VSS to pull-down drive the node nd42 in response to a signal from the node nd41. Herein, the external voltage VDD is supplied as the bulk voltage of the PMOS transistor P41.

The third buffer 42 includes a PMOS transistor P44 which is connected between the core voltage VCORE and a node nd43 to pull-up drive the node nd43 in response to the signal from the node nd40, an NMOS transistor N44 which is connected between the node nd43 and an node nd44 to pull-down drive the node nd43 in response to the signal from the node nd40, and an NMOS transistor N45 which is connected between the node nd44 and the ground voltage VSS to be turned-on in response to the signal from the node nd42.

The third voltage setting unit 44 includes a PMOS transistor P45 which is connected between the core voltage VCORE and the node nd43 to pull-up drive the node nd43 in response to the signal from the node nd42.

The third output unit 46 includes a transfer element IV41 which responds to the low-level test mode signal TM to invert the signal from the node nd43 and transfer it as the sense amplifier enable signal SEN_EN.

The operation of the semiconductor device configured as above will be described.

Figure 7:
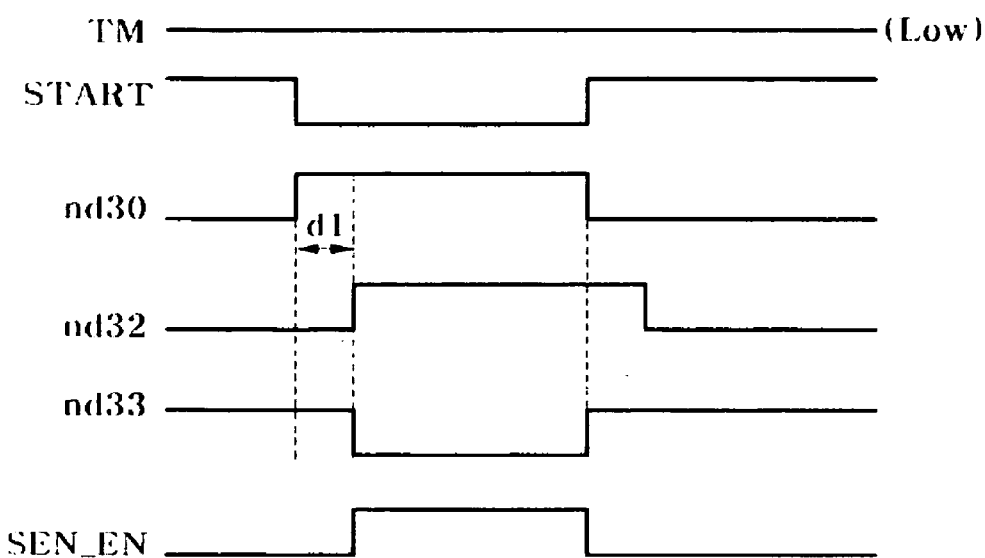
FIG. 7 is a timing diagram for explaining the operation of the first sensing delay unit shown in FIG. 6.

As shown in FIG. 7, when the low-level test mode signal TM is input, the NOR gate NR30 inverts the start signal START and outputs it to the node nd30. The signal from the node nd30 is delayed by a delay period d1 through the second delay unit 30 and is output to the node nd32. The NMOS transistor N35 included in the second buffer 32 is turned-on in a period where the signal from the node nd32 is a high level so that the second buffer 32 inverts the signal from the node nd30 into the signal from the node nd33 in a period where the signal from the node nd32 is the high level and transfers the inverted signal. Therefore, the enable start period of the sense amplifier enable signal SEN_EN is delayed by the delay period d1 relative to the enable start period of the start signal START.

Figure 8:
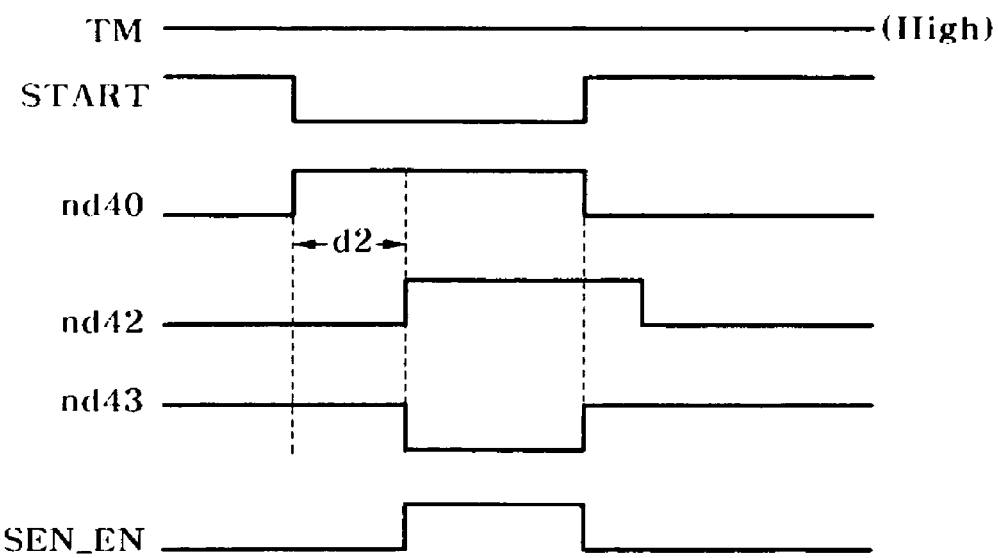
FIG. 8 is a timing diagram for explaining the operation of the second sensing delay unit shown in FIG. 6.
Figure 9:
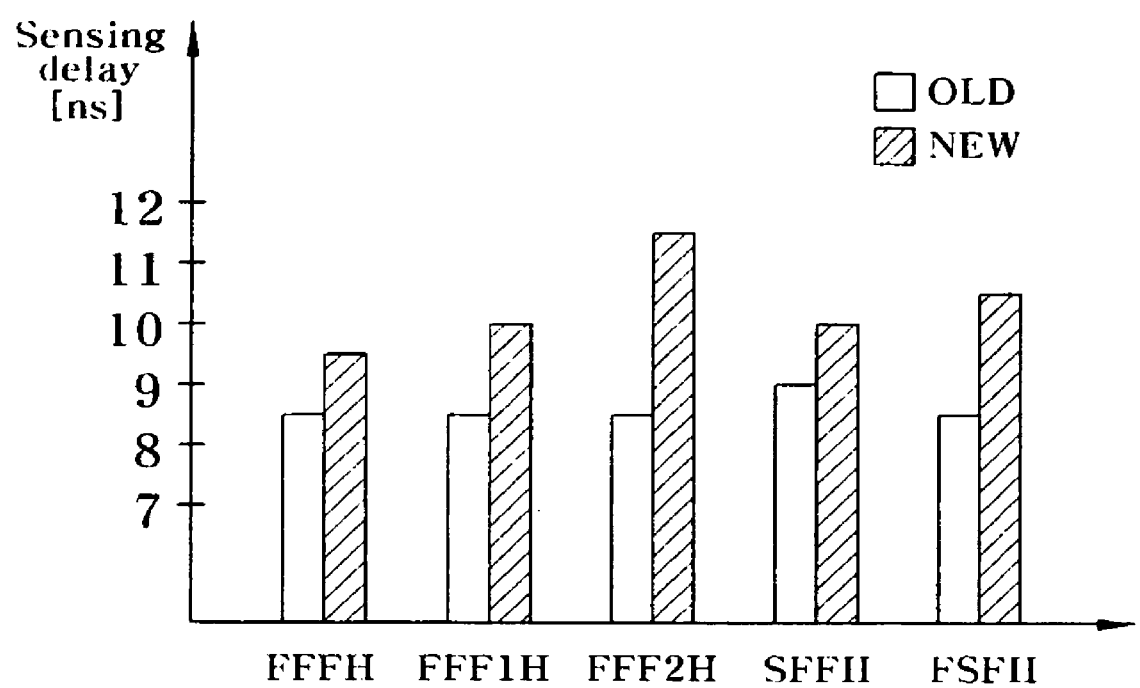
FIG. 9 is a diagram showing an increase of a sensing delay at a high external voltage level when applying the semiconductor memory device of the present disclosure.

As shown in FIG. 8, when the high-level test mode signal TM is input, the NAND gate ND40 inverts the start signal START and outputs it to the node nd40. The signal from the node nd40 is delayed by a delay period d2 through the third delay unit 40 and is output to the node nd42. The NMOS transistor N45 included in the third buffer 42 is turned-on in a period where the signal from the node nd32 is a high level so that the third buffer 42 inverts the signal from the node nd40 into the signal from the node nd43 in a period where the signal from the node nd42 is the high level and transfers the inverted signal. Therefore, the enable start period of the sense amplifier enable signal SEN_EN is delayed by the delay period d2 relative to the enable start period of the start signal START.

The sense amplifier enable signal SEN_EN generated in the first sensing delay unit 3 and the second sensing delay unit 4 of the present embodiment as described above controls the driving of the bit line sense amplifier 5. In other words, the bit line sense amplifier 5 is driven after securing the sufficient potential difference ΔV between the bit line pair BL, /BL by the sense amplifier enable signal SEN_EN.

The first sensing delay unit 3 and the second sensing delay unit 4 of the present embodiment are selectively operated in response to the test mode signal TM to control the enable start period of the start signal START, thereby generating the sense amplifier enable signal SEN_EN. In other words, when the test mode signal TM is the low level, the enable start period of the start signal START is delayed by the delay period d1 of the second delay unit 30 included in the first sensing delay unit 3 to generate the sense amplifier enable signal SEN_EN, and when the test mode signal TM is the high level, the enable start period of the start signal START is delayed by the delay period of the third delay unit 40 included in the second sensing delay unit 4 to generate the sense amplifier enable signal SEN_EN As described above, the semiconductor memory device according to the present disclosure controls the enable start period of the sense amplifier enable signal SEN_EN in accordance with the test mode signal TM, making it possible to confirm an effect according to a change in the enable start period of the sense amplifier enable signal SEN_EN at the high external voltage VDD level. In other words, the case where the enable start period of the sense amplifier enable signal SEN_EN is early by the first sensing delay unit 3 at the high external voltage VDD level can be compared with the case where the enable start period of the sense amplifier enable signal SEN_EN is constantly maintained by the sensing delay unit 4.

This disclosure claims priority to Korean application number 10-2008-0039589, filed on Apr. 28, 2008, the entire contents of which are incorporated herein by reference.

What is claimed is:

1. A sensing delay circuit includes:
a logic element configured to respond to a test mode signal to transfer a start signal;
a delay unit including a plurality of inverters having MOS transistors with controlled threshold voltage and configured to receive external voltage as bulk voltage and delay an output signal from the logic element by a predetermined period; and
a buffer configured to respond to an output signal from the delay unit to buffer the output signal from the logic element and output the buffered signal.

2. The sensing delay circuit of claim 1, wherein the logic element receives the test mode signal and the start signal and performs an NAND operation.

3. The sensing delay circuit of claim 1, wherein each of the plurality of inverters included in the delay unit includes:
a pull-up element configured to receive the external voltage as the bulk voltage and connected between an internal voltage and an output node to pull-up drive the output node in response to a signal from an input node; and
a pull-down element connected between the output node and a ground voltage to pull-down drive the output node in response to the signal from the input node.

4. The sensing delay circuit of claim 1, wherein the buffer includes:
a pull-up element connected between the internal voltage and a first node to pull-up drive the first node in response to the output signal from the logic element;
a pull-down element connected between the first node and a second node to pull-down drive the first node in response to the output signal from the logic element; and
an enable element connected between the second node and the ground voltage to be turned-on in response to the output signal from the delay unit.

5. The sensing delay circuit of claim 4, wherein the enable element is turned-on in a period elapsed by the delay period of the delay unit after the start signal is enabled.

6. The sensing delay circuit of claim 5, further including:
a voltage setting unit connected between the internal voltage and the first node to pull-up drive the first node in response to the output signal from the delay unit; and
an output unit configured to buffer the signal from the first node in response to the test mode signal and output the buffered signal as the sense amplifier enable signal.

7. A sensing delay circuit comprising:
a first sensing delay unit including MOS transistors with controlled threshold voltage, and configured to receive internal voltage as bulk voltage, control an enable period of a start signal in response to a test mode signal, and generate a sense amplifier enable signal; and
a second sensing delay unit including MOS transistors with controlled threshold voltage, and configured to receive external voltage as the bulk voltage, control the enable period of the start signal in response to the test mode signal, and generate the sense amplifier enable signal.

8. The sensing delay circuit of claim 7, wherein the first sensing delay unit includes:
a logic element configured to respond to a test mode signal to transfer a start signal;
a delay unit including a plurality of inverters having MOS transistors with controlled threshold voltage, and configured to receive internal voltage as bulk voltage, and delay an output signal from the logic element by a predetermined period; and
a buffer configured to respond to an output signal from the delay unit to buffer the output signal from the logic element and output it.

9. The sensing delay circuit of claim 8, wherein the logic element receives the test mode signal and the start signal performs an NAND operation.

10. The sensing delay circuit of claim 8, wherein each of the plurality of inverters included in the delay unit includes:
a pull-up element configured to receive the internal voltage as the bulk voltage and connected between an internal voltage and an output node to pull-up drive the output node in response to a signal from an input node; and
a pull-down element connected between the output node and a ground voltage to pull-down drive the output node in response to the signal from the input node.

11. The sensing delay circuit of claim 8, wherein the buffer includes:
a pull-up element connected between the internal voltage and a first node to pull-up drive the first node in response to the output signal from the logic element;
a pull-down element connected between the first node and a second node to pull-down drive the first node in response to the output signal from the logic element to; and
an enable element connected between the second node and the ground voltage to be turned-on in response to the output signal from the delay unit.

12. The sensing delay circuit of claim 11, wherein the enable element is turned-on in a period elapsed by the delay period of the delay unit after the start signal is enabled.

13. The sensing delay circuit of claim 11, further including:
a voltage setting unit connected between the internal voltage and the first node to pull-up drive the first node in response to the output signal from the delay unit; and
an output unit configured to buffer the signal from the first node in response to the test mode signal, and output the buffered signal as the sense amplifier enable signal.

14. The sensing delay circuit of claim 7, wherein the second sensing delay unit includes:
a logic element configured to respond to a test mode signal to transfer a start signal;
a delay unit including a plurality of inverters having MOS transistors with controlled threshold voltage, and configured to receive external voltage as bulk voltage, and delay an output signal from the logic element by a predetermined period; and
a buffer configured to respond to an output signal from the delay unit to buffer the output signal from the logic element and output the buffered signal.

15. The sensing delay circuit of claim 14, wherein the logic element receives the test mode signal and the start signal and performs an NAND operation.

16. The sensing delay circuit of claim 14, wherein each of the plurality of inverters included in the delay unit includes:
a pull-up element configured to receive the external voltage as the bulk voltage and connected between an internal voltage and an output node to pull-up drive the output node in response to a signal from an input node; and
a pull-down element connected between the output node and a ground voltage to pull-down drive the output node in response to the signal from the input node.

17. The sensing delay circuit of claim 14, wherein the buffer includes:
a pull-up element connected between the internal voltage and a first node to pull-up drive the first node in response to the output signal from the logic element;
a pull-down element connected between the first node and a second node to pull-down drive the first node in response to the output signal from the logic element; and
an enable element connected between the second node and the ground voltage to be turned-on in response to the output signal from the delay unit.

18. The sensing delay circuit of claim 17, wherein the enable element is turned-on in a period elapsed by the delay period of the delay unit after the start signal is enabled.

19. The sensing delay circuit of claim 11, further including:
a voltage setting unit connected between the internal voltage and the first node to pull-up drive the first node in response to the output signal from the delay unit; and
an output unit configured to buffer the signal from the first node in response to the test mode signal and output the buffered signal as the sense amplifier enable signal.

20. A semiconductor memory device including:
a logic element configured to respond to a test mode signal to transfer a start signal;
a delay unit including a plurality of inverters having MOS transistors with controlled threshold voltage, and configured to receive either an internal voltage or an external voltage as bulk voltage, and delay an output signal from the logic element by a predetermined period;
a buffer configured to respond to an output signal from the delay unit to buffer the output signal from the logic element and output the buffered signal; and
a sense amplifier configured to receive, and be driven by, a sense amplifier enable signal.

21. The semiconductor memory device of claim 20, wherein each of the plurality of inverters included in the delay unit includes:
a pull-up element configured to receive either the internal voltage or the external voltages the bulk voltage and connected between an internal voltage and an output node to pull-up drive the output node in response to a signal from an input node; and
a pull-down element connected between the output node and a ground voltage to pull-down drive the output node in response to the signal from the input node.

22. A semiconductor memory device including:
a first sensing delay unit including a first MOS transistor with controlled threshold voltage, and configured to receive internal voltage as bulk voltage, control an enable period of a start signal in response to a test mode signal, and generate a sense amplifier enable signal;
a second sensing delay unit including a second MOS transistor with controlled threshold voltage, and configured to receive external voltage as the bulk voltage, control the enable period of the start signal in response to the test mode signal, and generate the sense amplifier enable signal; and
a sense amplifier configured to receive, and be driven by, the sense amplifier enable signal.

23. The semiconductor memory device of claim 22, wherein the first sensing delay unit includes:
a logic element configured to respond to a test mode signal to transfer a start signal;
a delay unit including a plurality of inverters having MOS transistors with controlled threshold voltage, and configured to receive internal voltage as bulk voltage, and delay an output signal from the logic element by a predetermined period; and
a buffer configured to respond to an output signal from the delay unit to buffer the output signal from the logic element and output the buffered signal.

24. The semiconductor memory device of claim 22, wherein the second sensing delay unit includes:
a logic element configured to respond to a test mode signal to transfer a start signal;
a delay unit including a plurality of inverters having MOS transistors with controlled threshold voltage, and configured to receive external voltage as bulk voltage, and delay an output signal from the logic element by a predetermined period; and
a buffer configured to respond to an output signal from the delay unit to buffer the output signal from the logic element and output the buffered signal.

* * * * *